US008609469B2

(12) United States Patent
Ode et al.

(10) Patent No.: US 8,609,469 B2

(45) Date of Patent: Dec. 17, 2013

(54) METHOD OF MANUFACTURING SEMICONDUCTOR DEVICE

(75) Inventors: Hiroyuki Ode, Tokyo (JP); Hiroaki Ikeda, Tokyo (JP)

(73) Assignee: Elpida Memory, Inc., Tokyo (JP)

(*) Notice: Subject to any disclaimer, the term of this patent is extended or adjusted under 35 U.S.C. 154(b) by 282 days.

(21) Appl. No.: 13/079,465

(22) Filed: Apr. 4, 2011

(65) Prior Publication Data

US 2011/0244628 A1 Oct. 6, 2011

(30) Foreign Application Priority Data

Apr. 2, 2010 (JP) ................................ 2010-086030

(51) Int. Cl.

*H01L 21/56* (2006.01)

*H01L 21/58* (2006.01)

(52) U.S. Cl.

USPC .................. 438/124; 438/109; 257/E21.502; 257/E21.505

(58) Field of Classification Search

USPC ................................................ 438/109, 124

See application file for complete search history.

(56) References Cited

U.S. PATENT DOCUMENTS

| | | | |
|---|---|---|---|
| 7,402,517 B2 | 7/2008 | Yonker et al. | |
| 2006/0223312 A1 | 10/2006 | Yonker et al. | |
| 2008/0245304 A1 | 10/2008 | Yonker et al. | |
| 2009/0076220 A1* | 3/2009 | Shekhawat et al. | 525/89 |

FOREIGN PATENT DOCUMENTS

| | | |
|---|---|---|
| JP | 2005-032820 | 2/2005 |
| JP | 2005-142210 | 6/2005 |
| JP | 2007-036184 | 2/2007 |
| JP | 2008-537016 | 9/2008 |

* cited by examiner

*Primary Examiner* — Alexander Ghyka

(74) *Attorney, Agent, or Firm* — Young & Thompson

(57) ABSTRACT

A method of manufacturing a semiconductor device includes: supplying a supercritical fluid mixed with an under-fill material to a stacked unit, which has a plurality of stacked semiconductor chips; and filling the under-fill material in the space between the plurality of the semiconductor chips, by heating the stacked unit placed in the inside of the high-pressure vessel and curing the under-fill material flowing in the space between the plurality of the semiconductor chips by a polymerization reaction, while the supercritical fluid is being supplied.

20 Claims, 12 Drawing Sheets

4
5
P
6
7
30
9
10
1
2
3
11

1
2
3
4
5
P
6
7
9
30
10
11

9
32
32
31
31
31
31

24
25
25
30
22
23

27
22a
24
23
26
W
28
28
22
22
23
22c
21

METHOD OF MANUFACTURING SEMICONDUCTOR DEVICE

BACKGROUND OF THE INVENTION

1. Field of the Invention

The present invention relates to a method of manufacturing a semiconductor device having a plurality of stacked semiconductor chips.

2. Description of the Related Art

To meet demands for a reduction in the size of semiconductor devices, COC (Chip On Chip) techniques are known in which a plurality of semiconductor chips are stacked and mounted on a single semiconductor device (semiconductor package). COC semiconductor devices are disclosed in JP2005-142210A, JP2005-032820A, and JP2007-036184A.

More particularly, such a structure is known in which a plurality of semiconductor chips are stacked in such a way that bump electrodes are disposed on the top and under sides of semiconductor chips and through-vias are used to electrically connect the bump electrodes to circuit elements inside the semiconductor chips. According to this structure, semiconductor devices with a higher integration degree can be implemented, as compared with conventional COC semiconductor devices in which semiconductor chips are electrically connected through bonding wires.

Furthermore, for techniques related to the present invention, a film deposition method using supercritical technology is known, which is disclosed in WO2006105466.

Generally, a resin material referred to as an under-fill material is filled in the spaces between a plurality of stacked semiconductor chips. Conventionally, in the case in which semiconductor chips in a BGA (Ball Grid Array) structure are stacked and filled with an under-fill material, a so-called sidefill process is performed in which a liquid under-fill material is discharged onto the side surfaces of the semiconductor chips and the under-fill material is caused to flow between the semiconductor chips using capillary action produced in the spaces between the semiconductor chips. In this process, the under-fill material is caused to flow between the semiconductor chips, and then the under-fill material is heated and cured.

FIGS. 1A to 1D schematically show a method of filling an under-fill material, which is related to the present invention. As shown in FIG. 1A, semiconductor chip 52 is placed on board 51. Even in the case of using another semiconductor chip (not shown) instead of board 51, and stacking semiconductor chip 52 on this semiconductor chip, the method is similarly performed. The bonding parts of board 51 are electrically connected to the connecting terminals of semiconductor chip 52 through bump electrodes 53 of semiconductor chip 52.

Subsequently, as shown in FIG. 1B, liquid under-fill material 54 is dropped onto and attached to the side surfaces of semiconductor chip 52 placed on board 51. As shown in FIG. 1C, under-fill material 54 flows into the space between board 51 and semiconductor chip 52 because of capillary action produced in the space between board 51 and semiconductor chip 52. Thus, the inside of the space between board 51 and semiconductor chip 52 is filled with under-fill material 54.

Subsequently, as shown in FIG. 1D, board 51 and semiconductor chip 52 filled with under-fill material 54 are heated to cure under-fill material 54 filled in the space between board 51 and semiconductor chip 52. Consequently, filled part 54*a* is formed between board 51 and semiconductor chip 52.

As described above, in the case of stacking a plurality of semiconductor chips, which are to be electrically connected using through-vias, the semiconductor chips are formed with micro bump electrodes (micro bumps) having a height of a few tens micrometers.

In the case of stacking three or more semiconductor chips, it is necessary to reduce the height of the overall semiconductor package by also reducing the height of the micro bump as low as possible, in order to implement low-profile semiconductor packages. To this end, in the case of stacking three or more semiconductor chips, the spaces between the semiconductor chips are narrowed as well. As a result, according to the filling method which is related to the present invention, it is difficult to completely fill the under-fill material between the semiconductor chips without producing voids (cavities) therebetween because the under-fill material does not sufficiently flow in the spaces between the semiconductor chips.

In the case in which voids remain between the stacked semiconductor chips, it is likely that the under-fill material cracks when heated and cooled in the semiconductor device manufacturing processes after the stacking process. More specifically, in the filling method in which the under-fill material is caused to flow between the semiconductor chips using the above-mentioned capillary actions, it is difficult to fabricate highly reliable semiconductor devices because the spaces, which are narrowed between the vertically stacked semiconductor chips with the development of high integration, cannot be completely filled.

In addition, the method of filling an under-fill material, which is related to the present invention, has another problem in that an overflow (fillet) of under-fill material 54 is formed on the side surfaces of the semiconductor chip; the overflow laterally flows over in the direction orthogonal to the stacking direction of the semiconductor chip, as indicated by width A shown in FIG. 1D. The width of the overflow increases in the lateral direction of semiconductor chips as the number of semiconductor chips to be stacked increases. Because of this, in the case of stacking a large number of semiconductor chips, it is necessary to design the outside dimensions of the semiconductor package to include the overflow width. Therefore, the overflow width is a factor that hampers a reduction in the size of the overall semiconductor device.

JP2007-036184A proposes a method of controlling the overflow width by stacking a plurality of types of semiconductor chips having different outside dimensions. However, the method proposed in JP2007-036184β is not applicable to the case of stacking a plurality of semiconductor chips having the same outside dimensions.

SUMMARY

The present invention seeks to solve one or more of the above problems, or at least to solve some of them.

An aspect of a method of manufacturing a semiconductor device according to the present invention includes: supplying a supercritical fluid mixed with a resin material to a stacked unit, which has a plurality of stacked semiconductor chips; and filling the spaces between the plurality of the semiconductor chips with the resin material, by heating the stacked unit in the inside of the processing vessel and curing the resin material flowing in the spaces between the plurality of the semiconductor chips by a polymerization reaction, while the supercritical fluid is being supplied.

According to the method of manufacturing a semiconductor device of the present invention mentioned above, in filling the resin material in the spaces between the stacked semiconductor chips, a supercritical film deposition process is applied. In the supercritical film deposition process, the resin material is mixed in the supercritical fluid, the resin material is caused to flow into the spaces between the semiconductor chips, and the resin material is polymerized on the surfaces between the plurality of the semiconductor chips, so that the spaces between the stacked semiconductor chips are sufficiently filled with the resin material. Therefore, according to the present invention, the resin material is sufficiently filled between the plurality of the semiconductor chips. Accordingly, it is possible to prevent cavities from being produced between the plurality of the semiconductor chips.

In addition, the polymerization reaction of the resin material takes place almost simultaneously between the individual semiconductor chips, from the surfaces of the individual semiconductor chips vertically upward. As a result, the overflow, which is formed by the resin filling material running in a direction orthogonal to the stacking direction of the semiconductor chips (the height direction of the stacked unit) from the side surfaces of the stacked unit, is formed have a shape such that it follows the side surfaces of each semiconductor chip. Consequently, it is possible to prevent the overflow from forming in a tapered shape in which the overflow becomes wider vertically downward along the stacked unit. Accordingly, according to the present invention, it is possible to reduce the overflow width.

According to the present invention, in order to improve the reliability of semiconductor devices, it is possible to prevent voids or cracks from being produced in a resin material between semiconductor chips. In addition, according to the present invention, in order to reduce the size of semiconductor devices, it is possible to prevent a resin material that fills the spaces between semiconductor chips from running in a direction that is orthogonal to the stacking direction of the semiconductor chips.

BRIEF DESCRIPTION OF THE DRAWINGS

The above features and advantages of the present invention will become more apparent from the following description of certain preferred embodiments taken in conjunction with the accompanying drawings, in which.

DETAILED DESCRIPTION OF THE PREFERRED EMBODIMENTS

The invention will now be described herein with reference to illustrative embodiments. Those skilled in the art will recognize that many alternative embodiments can be accomplished using the teachings of the present invention and that the invention is not limited to the embodiments illustrated for explanatory purposes.

First Embodiment

In a method of manufacturing a semiconductor device according to this embodiment, a resin material is filled in the spaces between stacked semiconductor chips using a film deposition process in a supercritical state. Here, a supercritical state refers to a state in which the pressure and temperature to be applied to a substance are at and beyond a value (critical point) specific to this substance to cause the substance to have characteristics of both gas and liquid.

Figure 3:
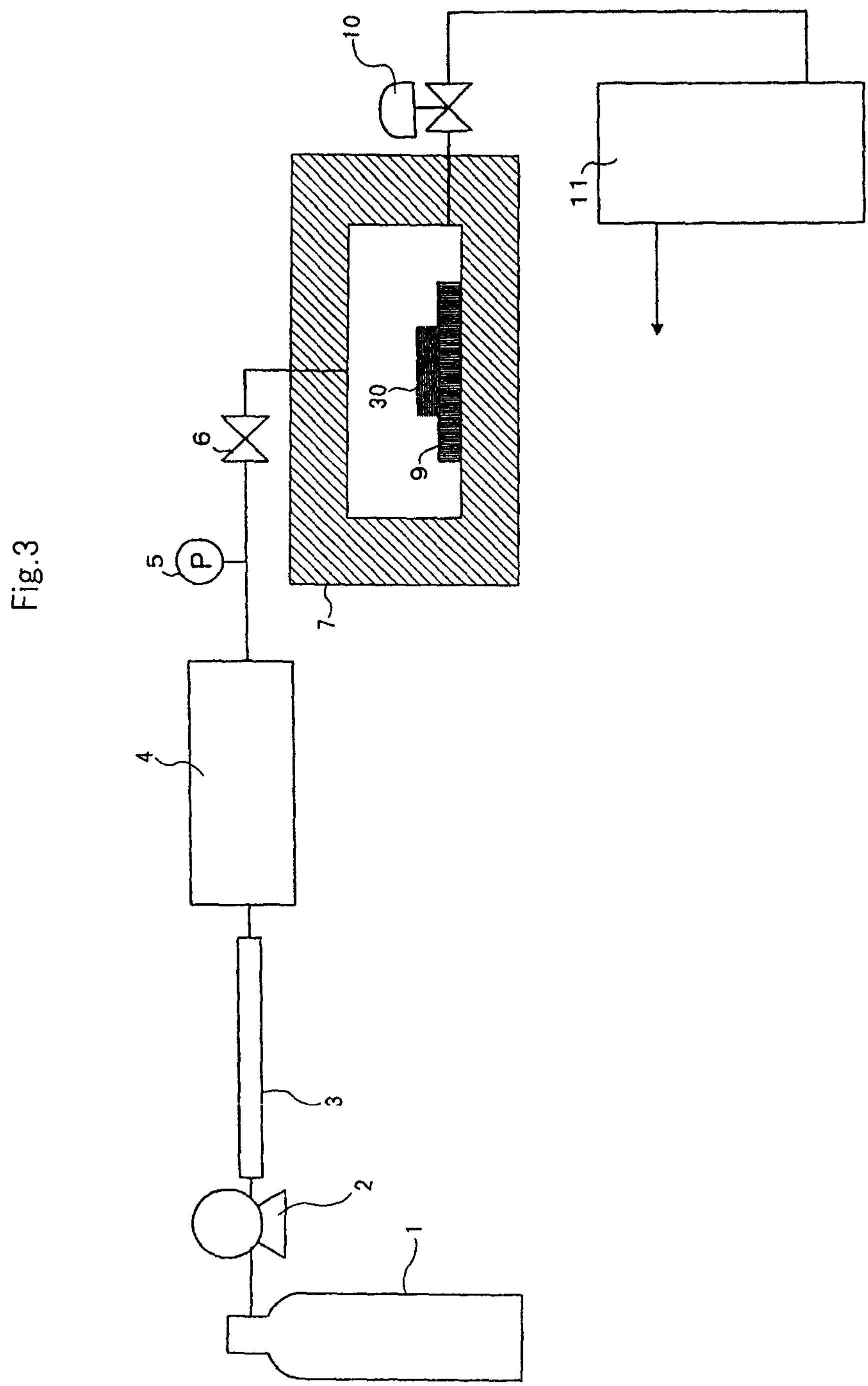
FIG. 3 is a schematic diagram depicting a supercritical apparatus used for a method of manufacturing a semiconductor device according to a first embodiment.
Figure 4:
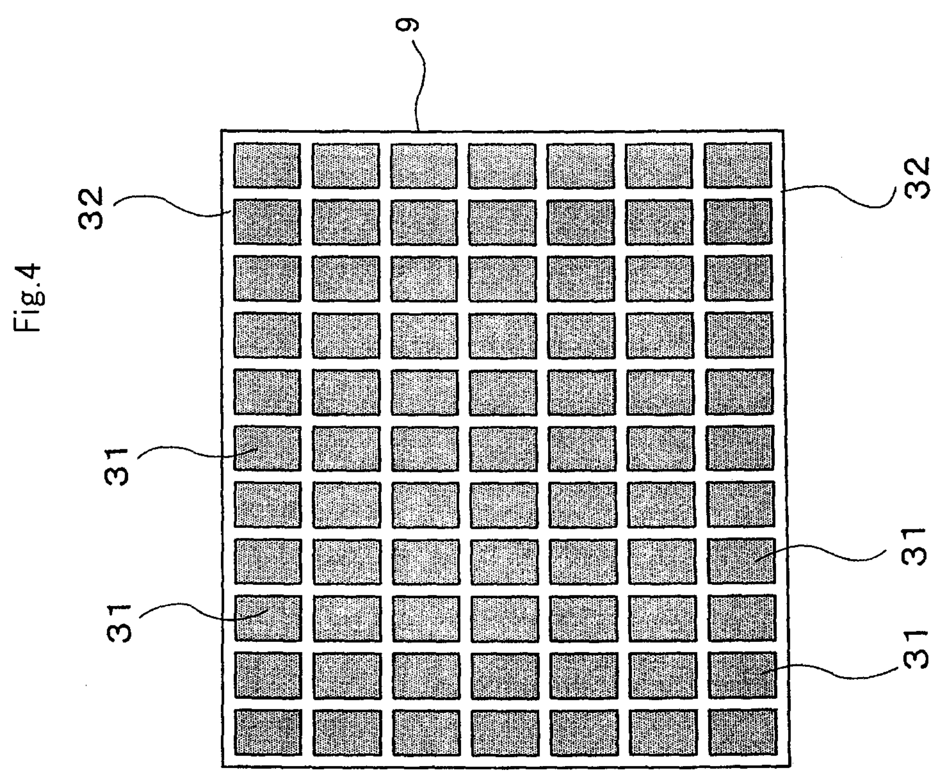
FIG. 4 is a schematic plan view depicting a heater included a high-pressure vessel of the supercritical apparatus.

FIG. 3 shows a schematic diagram depicting a supercritical apparatus used for the method of manufacturing a semiconductor device according to the first embodiment. FIG. 4 shows a schematic plan view depicting heater 9 included in the high-pressure vessel of the supercritical apparatus.

As shown in FIG. 3, the supercritical apparatus used for the method of manufacturing a semiconductor device comprises high-pressure vessel 7 in which stacked unit 30 having a plurality of stacked semiconductor chips is placed as a processing vessel, and comprises supercritical fluid gas supply source 1 that supplies a raw material for a supercritical fluid, a supercritical fluid supply system including supercritical fluid pressure pump 2 and heat exchanger 3, raw resin material supply system 4 that mixes a raw resin material in the supercritical fluid and supplies the raw resin material to high-pressure vessel 7, and separation and recovery chamber 11 that recovers waste from high-pressure vessel 7.

For the supercritical fluid supplied from supercritical fluid gas supply source 1, carbon dioxide ($CO_2$), for example, is used. On the supply side passage of high-pressure vessel 7, high-pressure valve 6 and pressure gage 5 are disposed. Furthermore, on the discharge side passage of high-pressure vessel 7, backpressure regulator 10 is disposed.

Heater 9 that heats semiconductor chips forming stacked unit 30 is disposed in high-pressure vessel 7. High-pressure vessel 7 is formed to heat the semiconductor chips to temperatures necessary for polymerization and film deposition of the raw resin material using heater 9. Stacked unit 30 having a plurality of the stacked semiconductor chips is placed on heater 9.

Moreover, high-pressure vessel 7 is formed to control its temperature independently of the temperature of heater 9, controlling its temperature so as not to heat the main body of high-pressure vessel 7 beyond a predetermined temperature. With this structure, it is possible to avoid the occurrence of a polymerization reaction of the resin material at locations at which polymerization reactions are unnecessary, including the inner walls or the like of high-pressure vessel 7.

As shown in FIG. 4, on the main surface of heater 9, a plurality of chip mounting areas 31 are provided in a matrix, on which a plurality of stacked units 30 are placed. Thus, heater 9 allows the plurality of stacked units 30 to be placed in an array on the flat surface. The surface of heater 9 is covered with heat-resistant material 32 such as a polymer film or porous material in the outer circumferential part around each of chip mounting areas 31. Heat-resistant material 32 prevents the occurrence of a polymerization reaction of the raw resin material at locations other than chip mounting areas 31.

For the under-fill material, it is possible to use resin materials that can be filled in the spaces between stacked semiconductor chips by curing these resin materials by polymerization reactions. A filling method will be described using an epoxy resin material for one specific example of raw resin materials.

Figure 5:
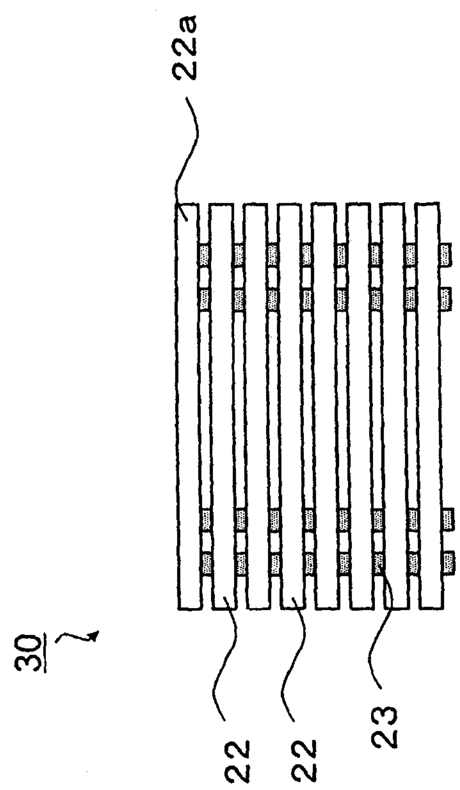
FIG. 5 is a vertical cross sectional view depicting a stacked unit used in the method of manufacturing a semiconductor device according to the first embodiment.
Figure 6:
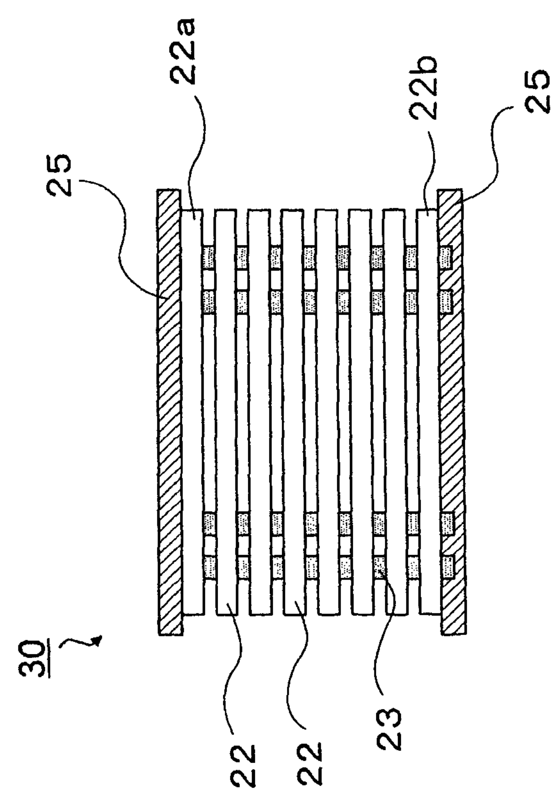
FIG. 6 is a vertical cross sectional view illustrative of the method of manufacturing a semiconductor device according to the first embodiment.
Figure 7:
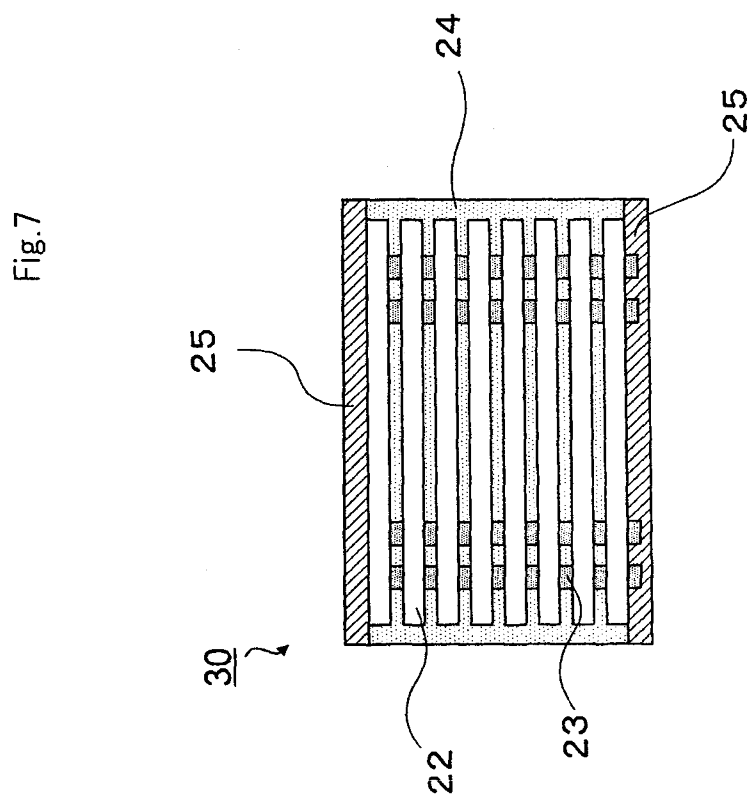
FIG. 7 is a vertical cross sectional view illustrative of the method of manufacturing a semiconductor device according to the first embodiment.
Figure 8:
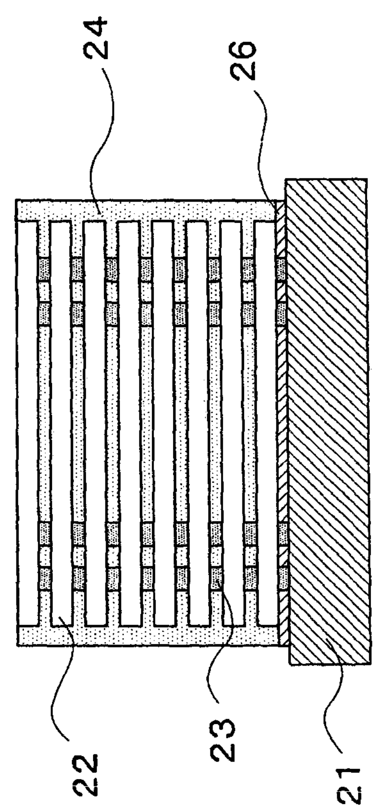
FIG. 8 is a vertical cross sectional view illustrative of the method of manufacturing a semiconductor device according to the first embodiment.
Figure 9:
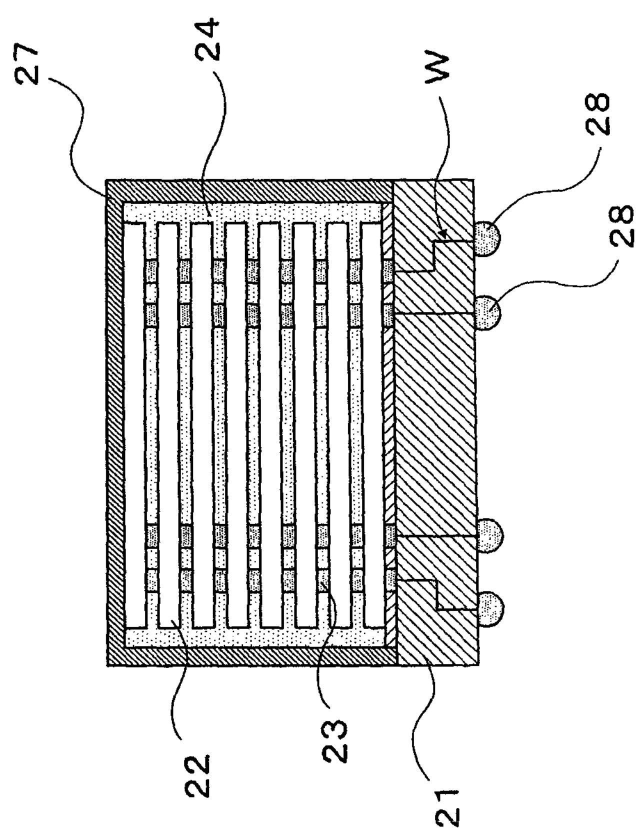
FIG. 9 is a vertical cross sectional view depicting a semiconductor device fabricated by the method of manufacturing a semiconductor device according to the first embodiment.

FIG. 5 is a vertical cross sectional view depicting a stacked unit used for the method of manufacturing a semiconductor device according to the first embodiment. FIGS. 6 to 8 are vertical cross sectional views illustrative of the method of manufacturing a semiconductor device according to the first embodiment. FIG. 9 is a vertical cross sectional view depicting a semiconductor device fabricated by the method of manufacturing a semiconductor device according to the first embodiment.

First, as shown in FIG. 5, stacked unit 30 is prepared, in which a plurality of semiconductor chips 22 having therein through-vias, not shown, are vertically arranged and adjacent to each other, and adjacent semiconductor chips 22, which are vertically arranged, are bonded to each other through bump electrodes 23 disposed on the surfaces of semiconductor chips 22. In addition, it is may be possible that semiconductor chips 22 to be stacked include different types of semiconductor chips.

In this embodiment, as shown in FIG. 5, an exemplary structure is shown in which bump electrodes 23 are not disposed on the top side of topmost semiconductor chip 22*a*. However, the present invention is not limited to this structure. It is may be possible to dispose bump electrodes on the top side of topmost semiconductor chip 22*a*. In addition, in this embodiment, one exemplary case will be described, in which a plurality of semiconductor chips having the same outside dimensions are stacked.

Subsequently, as shown in FIG. 6, both the top side of topmost semiconductor chip 22*a* and the under side of lowermost semiconductor chip 22*b* in stacked unit 30 are covered with masking material 25. The side of lowermost semiconductor chip 22*b*, on which bump electrodes 23 are disposed (the under side of semiconductor chip 22*b* in the structure shown in FIG. 6), is covered with masking material 25 in such a way that bump electrodes 23 are not exposed.

As masking material 25, it is possible to use materials having heat-resistant properties such as a polymer film, urethane resin material, porous material, etc. Covering the top and under sides of stacked unit 30 with masking material 25 prevents under-fill material 24 from attaching to the top and under sides of stacked unit 30. As regards masking material 25, a masking material whose size is slightly larger than the size of the top side of semiconductor chip 22*a* and the under side of semiconductor chip 22*b* is used.

Subsequently, stacked unit 30 covered with masking material 25 is placed on heater 9 in the inside of high-pressure vessel 7 of the supercritical apparatus shown in FIG. 3. Individual stacked units 30 are separately placed on chip mounting areas 31 of heater 9 as shown in FIG. 4. Consequently, it is possible to collectively heat a plurality of stacked units 30 according to the number of chip mounting areas 31 included in heater 9.

High-pressure vessel 7 and heater 9 are heated to a temperature of about 40° C. in advance. In this embodiment, a case will be described in which carbon dioxide ($CO_2$) is used for a supercritical fluid.

$CO_2$ gas is supplied from supercritical fluid supply source 1. Pressure pump 2 and heat exchanger 3 are used to adjust the $CO_2$ gas at a predetermined pressure and temperature, so that $CO_2$ in a supercritical state, which is a supercritical fluid, can be obtained.

Subsequently, high-pressure valve 6 is switched to open, and the supercritical fluid is supplied to the inside of high-pressure vessel 7 to fill the inside of high-pressure vessel 7 with $CO_2$ in the supercritical state. The pressure in the inside of high-pressure vessel 7 is adjusted by controlling the opening and closing of backpressure regulator 10.

When the supercritical $CO_2$ fluid in the inside of high-pressure vessel 7 reaches a predetermined condition (for example, a pressure of 10 MPa, and a temperature of 40° C.), heater 9 in the inside of high-pressure vessel 7 is used to heat stacked unit 30 to a predetermined temperature of 100° C., for example. This predetermined temperature is set to a temperature at which a polymerization reaction of the resin material used for under-fill material 24 occurs.

Subsequently, as the temperature of stacked unit 30 is maintained at a predetermined temperature, 100° C., in this embodiment, a raw material for an epoxy resin material supplied from raw resin material supply system 4 is mixed in the supercritical $CO_2$ fluid, and then introduced into high-pressure vessel 7. For the raw material for the epoxy resin material, a bisphenol type epoxy resin and polyamine are used, for example.

The epoxy resin material, which reaches stacked unit 30 in the inside of high-pressure vessel 7, is heated while gradually flowing into the spaces between stacked semiconductor chips 22, and starts polymerization reactions. Even after starting the polymerization reactions, the epoxy resin material is supplied to the inside of high-pressure vessel 7, and stacked unit 30 is heated without stopping. The supply of raw material for the epoxy resin material is stopped when the spaces between semiconductor chips 22 are sufficiently filled with the epoxy resin material.

In addition, the polymerization reactions take place almost simultaneously in the individual spaces between semiconductor chips 22 in a bottom-up manner, from the surfaces of semiconductor chips 22 vertically upward. As a result, when the epoxy polymerization reactions of the resin material filled between semiconductor chips 22 in stacked unit 30 take place to finish curing the resin material, supplying the raw material for the epoxy resin material and heating stacked unit 30 by heater 9 are stopped.

According to this embodiment, by supplying the raw material for the epoxy resin material using $CO_2$ in the supercritical state, it is possible to fill the epoxy resin material in the spaces between semiconductor chips 22 in high density without producing voids in the epoxy resin material, even in the case in which the spaces between stacked semiconductor chips 22 are relatively narrow.

After that, $CO_2$ in the supercritical state is discharged from high-pressure vessel 7 through separation and recovery chamber 11, the pressure in the inside of high-pressure vessel 7 is reduced to atmospheric pressure, and then stacked unit 30 is removed from high-pressure vessel 7.

As shown in FIG. 7, stacked unit 30 that is removed from high-pressure vessel 7 of the supercritical apparatus is filled with the epoxy resin material in which under-fill material 24 is cured in the spaces between semiconductor chips 22. At this time, the epoxy resin material is not attached to the top side of topmost semiconductor chip 22*a* and the under side of lowermost semiconductor chip 22*b* in stacked unit 30 because the top and under sides are covered with masking material 25. Subsequently, as shown in FIG. 8, masking material 25 is removed from the top and under sides of stacked unit 30.

Subsequently, adhesive member 26 is coated over the top side of wiring substrate 21 formed with wires and bonding pads for electrically connecting to stacked unit 30. For adhesive member 26, NCP (Non Conductive Paste: nonconductive resin material) is used, for example.

Stacked unit 30 is placed on wiring substrate 21, on which adhesive member 26 is coated, and bump electrodes 23 on lowermost semiconductor chip 22*b* are bonded to the bonding pads on wiring substrate 21 using thermocompression bonding. At this time, adhesive member 26 is filled between stacked unit 30 and wiring substrate 21, bonding and fixing stacked unit 30 to wiring substrate 21.

Subsequently, as shown in FIG. 9, in order to protect stacked unit 30, sealing material (resin molding material) 27 that entirely covers stacked unit 30 is further formed using a publicly known technique.

Lastly, conductive metal balls, solder balls, for example, are formed on wiring substrate 21 for external terminals 28, wires W are connected to external terminals 28, and then a semiconductor device is completed. In other words, external terminals 28 are individually and electrically connected to bump electrodes 23 of stacked unit 30 through wires W inside wiring substrate 21.

As well, a wiring substrate 21, on which a plurality of the stacked units 30 are mounted, is individually cut into a plurality of semiconductor devices. In an individual semiconductor device, an end face of sealing material 27 is flush with an end face of wiring substrate 30.

In addition, it is may be possible to form the LGA (Land Grid Array) package in which flat metals are arranged for external terminals, instead of the BGA (Ball Grid Array) package using metal balls for external terminals 28. Furthermore, it is may be possible that under-fill material 24 is left as is filled in the spaces between semiconductor chips 22, without providing sealing material 27 for protection, which entirely covers stacked unit 30, depending on the use applications of the semiconductor device. Moreover, for the supercritical fluid, it is may be possible to use fluids such as butane, ethylene, and ethane, other than carbon dioxide mentioned above.

In addition, the resin filling material used for the under-fill material is not limited to epoxy resin materials. It is may be possible to use other materials as long as they are materials that cause polymerization reactions. It is possible to fill materials by the method according to the present invention as long as the materials are thermosetting resin materials or thermoplastic resin materials to cause polymerization reactions by heating. It is possible that the resin material is supplied while being properly heated depending on the curing properties of the resin material for use in filling the spaces and the stacked unit is then removed from the high-pressure vessel of the supercritical apparatus at the point in time at which polymerization reactions are ended.

Figure 1A:
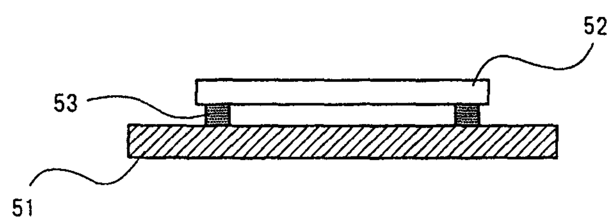
FIGS. 1A to 1D are vertical cross sectional views depicting a method of filling an under-fill material, which is related to the present invention.
Figure 1B:
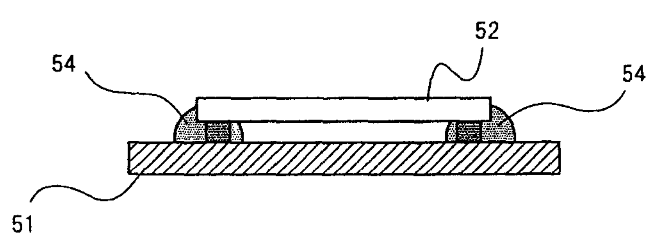
Figure 1C:
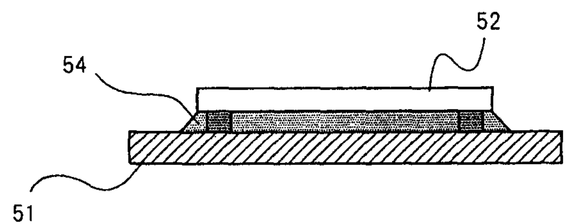
Figure 1D:
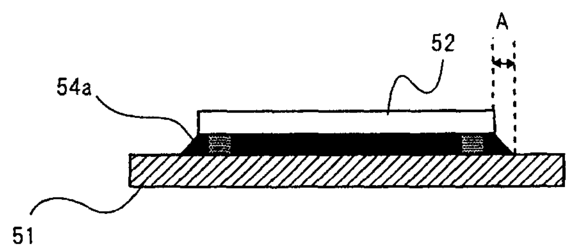
Figure 2:
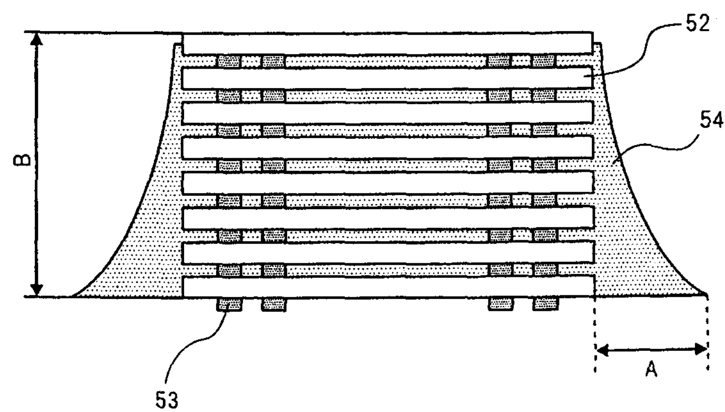
FIG. 2 is a vertical cross sectional view depicting a stacked unit formed according to the method of filling an under-fill material, which is related to the present invention.

Here, for a comparative example, a case will be described in which the method of filling an under-fill material, which is related to the present invention, is used to form a semiconductor device similar to the semiconductor device of the embodiment. FIG. 2 shows the shape of under-fill material 54 after under-fill material 54 is filled in the spaces between adjacent semiconductor chips 52 when the filling method is used, which is related to the present invention.

As shown in FIG. 2, an overflow (fillet) in a tapered shape is formed on the side surfaces of a stacked unit; the shape is narrowed upward in association with discharging under-fill material 54. This overflow is formed in such a way that under-fill material 54 on the side surfaces of semiconductor chips 52 runs in a nearly tapered shape due to the influence of gravity on under-fill material 54, while under-fill material 54 is flowing between semiconductor chips 52.

Width A of the overflow was measured; the overflow was produced when under-fill material 54 was filled by the filling method, which is related to the present invention, where a stacked unit formed of eight stacked semiconductor chips was used. As the result, in the bottom part of the stacked unit, at which the width of the overflow was at the maximum, the overflow was formed to have width A, which was almost one half of height B of the overall stacked unit having eight stacked semiconductor chips 52, as shown in FIG. 2. The maximum width of the overflow increases as the number of semiconductor chips 52 to be stacked increases.

In contrast to this, in this embodiment, it is possible to prevent the resin material from attaching to the locations other than the side surfaces by masking material 25 because the polymerization reaction of the resin material for under-fill material 24 occurs only near the side surfaces of semiconductor chips 22. In addition, polymerization reactions take place almost simultaneously in the individual spaces between semiconductor chips 22, from the surfaces of individual semiconductor chips 22 vertically upward in a bottom-up manner. As the result, as shown in FIG. 7, the overflow is formed have a shape such that follows the side surfaces of individual semiconductors chips 22, and it is also possible to prevent the overflow from forming in a tapered shape in which the overflow becomes wider vertically downward. Therefore, in this embodiment, it is possible to reduce width A of the overflow to one half or below that formed by the filling method, which is related to the present invention.

In the foregoing filling method, which is related to the present invention, it is difficult to completely fill resin material, which is the under-fill material, in the spaces between semiconductor chips having such a structure in which the space between stacked semiconductor chips is narrow (the size of the bump electrode is small), a structure with a five-micrometer space or below, for example.

On the other hand, according to the method of manufacturing of this embodiment, it is possible to completely fill the resin material for under-fill material 24 in the spaces between the stacked semiconductor chips 22, even in the case in which the space between semiconductor chips is five micrometers or below, as discussed above. As a result, in this embodiment, it is possible to prevent voids from being produced in the spaces between semiconductor chips 22, and to prevent under-fill material 24 from cracking when heated and cooled in the processes after the filling process. Accordingly, according to this embodiment, it is possible to fabricate highly reliable semiconductor devices.

In addition, according to this embodiment, it is possible to reduce the overflow width of under-fill material 24 on the side surfaces of the stacked semiconductor chips 22 to be less than the overflow width by using the filling method, which is related to the present invention. Accordingly, in this embodiment, it is possible to decrease the area occupied by the stacked unit in the semiconductor device for implementing highly integrated semiconductor devices.

As discussed above, the method of manufacturing according to this embodiment includes the processes of: supplying a supercritical fluid mixed with a resin filling material to the inside of high-pressure vessel 7 (processing vessel) which contains stacked unit 30 having a plurality of stacked semiconductor chips 22; and filing the resin material in the spaces between the plurality of semiconductor chips 22, by heating stacked unit 30 in the inside of high-pressure vessel 7 (processing vessel) and curing the resin material flowing between the plurality of semiconductor chips 22 by a polymerization reaction, while the supercritical fluid is being supplied.

More specifically, the method of manufacturing according to this embodiment includes the processes of: stacking a plurality of semiconductor chips 22 to form stacked unit 30 having the plurality of stacked semiconductor chips 22 electrically connected to each other; and covering the top side of topmost semiconductor chip 22*a* and the under side of lowermost semiconductor chip 22*b* in stacked unit 30 with masking material 25. Furthermore, this method of manufacturing further includes the processes of: supplying a supercritical fluid mixed with a resin filling material to the inside of high-pressure vessel 7 (processing vessel) which contains stacked unit 30 covered with masking material 25; and filling the resin material in the spaces between the plurality of semiconductor chips 22, by heating stacked unit 30 in the inside of high-pressure vessel 7 (processing vessel) and curing the resin material flowing in the spaces between the plurality of semiconductor chips 22 by a polymerization reaction, while the supercritical fluid is being supplied. Moreover, this method of manufacturing further includes the processes of: removing masking material 25 from stacked unit 30 filled with the resin material; mounting stacked unit 30 filled with the resin material in the spaces between the plurality of semiconductor chips 22 on wiring substrate 21; and covering the outer side of stacked unit 30 mounted on wiring substrate 21 with sealing material 27.

Second Embodiment

Figure 10:
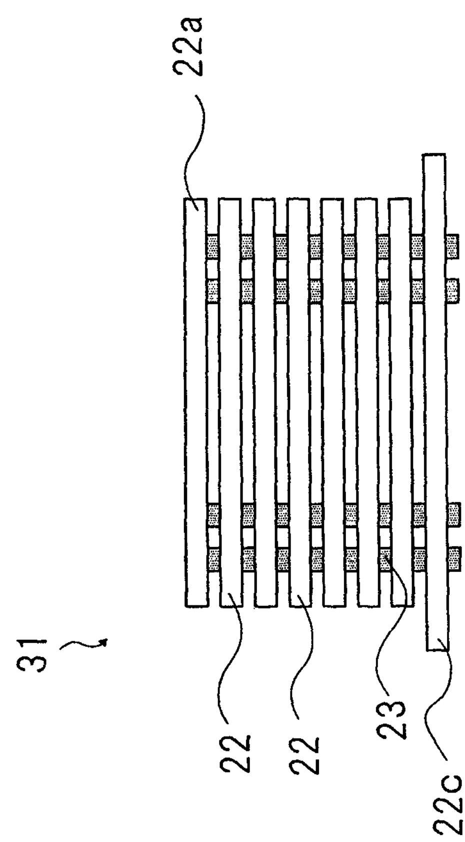
FIG. 10 is a vertical cross sectional view depicting a stacked unit used in a method of manufacturing a semiconductor device according to a second embodiment.
Figure 11:
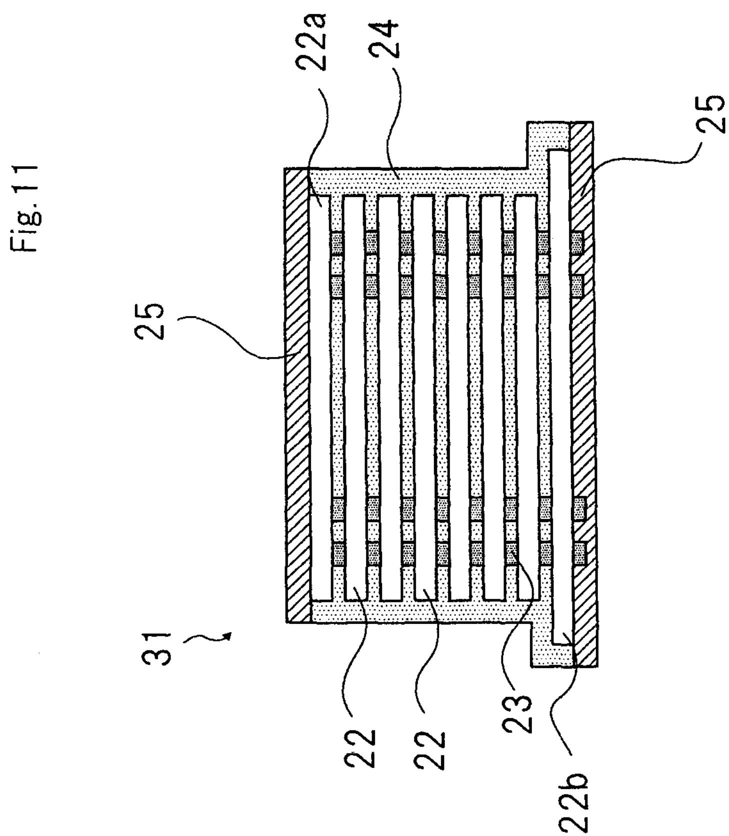
FIG. 11 is a vertical cross sectional view illustrative of the method of manufacturing a semiconductor device according to the second embodiment.
Figure 12:
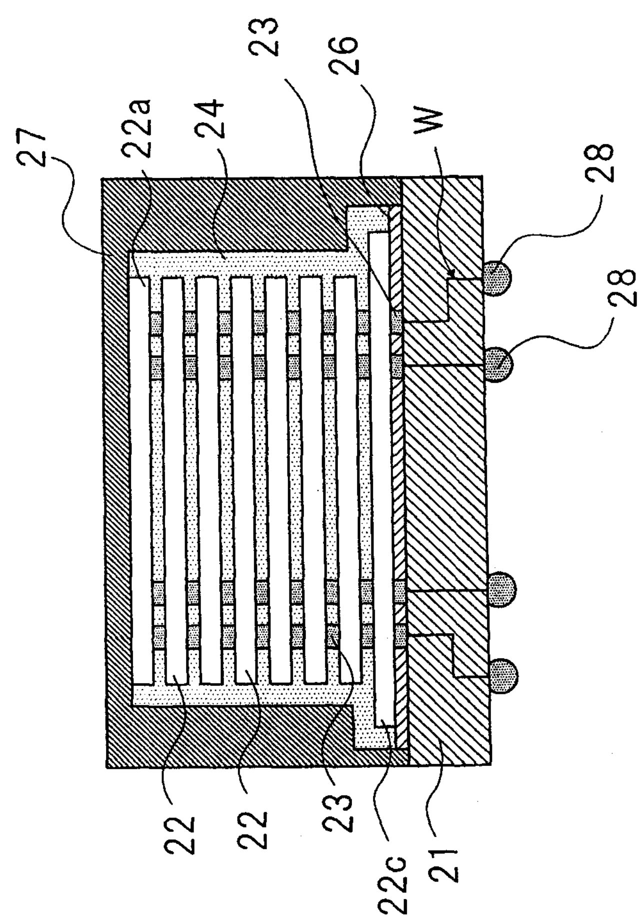
FIG. 12 is a vertical cross sectional view depicting a semiconductor device fabricated by the method of manufacturing a semiconductor device according to the second embodiment.

Next, an exemplary structure in which the outside dimensions of semiconductor chips that are to be stacked are different will be described with reference to the drawings. FIG. 10 is a vertical cross sectional view depicting a stacked unit used in a method of manufacturing a semiconductor device according to a second embodiment. FIG. 11 is a vertical cross sectional view illustrative of the method of manufacturing a semiconductor device according to the second embodiment. FIG. 12 is a vertical cross sectional view depicting a semiconductor device fabricated by the method of manufacturing a semiconductor device according to the second embodiment. In addition, in the second embodiment, the same components as those in the first embodiment are designated the same numerals and signs that are in the first embodiment, and the description is omitted.

As shown in FIG. 10, stacked unit 31 is prepared, in which only the outside dimensions of lowermost semiconductor chip 22*c* are greater than the outside dimensions of other semiconductor chips 22 placed on and above lowermost semiconductor chip 22*c* among a plurality of semiconductor chips 22.

Subsequently, as shown in FIG. 11, the top side of topmost semiconductor chip 22*a* and the under side of lowermost semiconductor chip 22*c* in stacked unit 31 are covered with masking material 25. As regards masking material 25, a masking material whose size is slightly larger than the top side of semiconductor chip 22*a* and the under side of semiconductor chip 22*c* is used.

Subsequently, stacked unit 31 is placed in the inside of high-pressure vessel 7 of the supercritical apparatus mentioned above, and an epoxy resin material for under-fill material 24 is filled in the spaces between semiconductor chips 22 using a supercritical film deposition process. At this time, an overflow of the epoxy resin material is formed have a shape such that it roughly follows the side surfaces of semiconductor chips 22 forming stacked unit 31.

Masking material 25 is then removed from the top and under sides of stacked unit 31. Subsequently, as shown in FIG. 12, stacked unit 31 is placed on wiring substrate 21, and wiring substrate 21 is electrically connected to lowermost semiconductor chip 22*c* of stacked unit 31. Stacked unit 31, which is mounted on wiring substrate 21, is then entirely covered with sealing material 27. Lastly, solder balls are used to form external terminals 28 on the back side of wiring substrate 21, and thus a semiconductor device is completed.

According to the second embodiment, similar to the first embodiment, in order to improve the reliability of the semiconductor device, it is possible to prevent the epoxy resin material in the spaces between semiconductor chips 22 from cracking. In addition, according to this embodiment, in order to reduce the semiconductor device in size, it is possible to prevent the epoxy resin material filled between semiconductor chips 22 from widening in the direction orthogonal to the stacking direction of semiconductor chips 22.

It is apparent that the present invention is not limited to the above embodiments, but may be modified and changed without departing from the scope and spirit of the invention.

What is claimed is:

1. A method of manufacturing a semiconductor device, comprising:

supplying a mixture of a supercritical fluid and a resin material to a stacked unit, which has a plurality of stacked semiconductor chips; and filling said resin material in the space between the plurality of said semiconductor chips, while heating said stacked unit and curing said resin material flowing in the space between the plurality of said semiconductor chips, while said mixture is being supplied.

2. A method of manufacturing a semiconductor device, comprising:

supplying a mixture of a supercritical fluid and a resin material to an inside of a processing vessel which contains a stacked unit, said stacked unit having a plurality of stacked semiconductor chips; and filling said resin material in the space between the plurality of said semiconductor chips, while heating said stacked unit in the inside of said processing vessel and curing said resin material flowing in the space between the plurality of said semiconductor chips by a polymerization reaction.

3. The method of manufacturing a semiconductor device according to claim 2, wherein said mixture is supplied to said inside of said processing vessel at a predetermined pressure.

4. The method of manufacturing a semiconductor device according to claim 2, wherein said supercritical fluid is composed of carbon dioxide or butane or ethylene or ethane.

5. The method of manufacturing a semiconductor device according to claim 2, further comprising:

before said supplying, covering a top side of a topmost semiconductor chip and an under side of a lowermost semiconductor chip in said stacked unit with a masking material; and after said filling, removing said masking material from said stacked unit.

6. The method of manufacturing a semiconductor device according to claim 2, further comprising:

mounting said stacked unit, in which said resin material has been filled in the space between the plurality of said semiconductor chips, on a wiring substrate; and covering said stacked unit mounted on said wiring substrate with a sealing material.

7. The method of manufacturing a semiconductor device according to claim 2, wherein when the polymerization reaction of said resin material filled in the space between the plurality of said semiconductor chips in said stacked unit is finished, heating said stacked unit is stopped.

8. The method of manufacturing a semiconductor device according to claim 2, wherein in said filling process, said supplying of said mixture is stopped when the space between the plurality of semiconductor chips is filled with said resin material.

9. The method of manufacturing a semiconductor device according to claim 2, wherein in said filling process, said processing vessel is formed to control its temperature independently of the temperature of a heating member which heats said stacked unit.

10. The method of manufacturing a semiconductor device according to claim 6, further comprising:

after said covering, ensuring that an end face of said sealing material, which covers said stacked unit, is flush with an end face of said wiring substrate.

11. The method of manufacturing a semiconductor device according to claim 6, wherein in said mounting process, said wiring substrate and said stacked unit are bonded by an adhesive member.

12. The method of manufacturing a semiconductor device according to claim 2, wherein said resin material is an epoxy resin material.

13. A method of manufacturing a semiconductor device, comprising:

stacking a plurality of semiconductor chips to form a stacked unit, said stacked unit having the plurality of said stacked semiconductor chips electrically connected to each other;

covering a top side of a topmost semiconductor chip and an under side of a lowermost semiconductor chip in said stacked unit with a masking material;

supplying a mixture of a supercritical fluid and a resin material to an inside of a processing vessel in which is contained said stacked unit covered with said masking material;

filling said resin material in the space between the plurality of said semiconductor chips, while heating said stacked unit in the inside of said processing vessel and curing said resin material flowing in the space between the plurality of said semiconductor chips by a polymerization reaction, while said mixture is being supplied;

removing said masking material from said stacked unit filled with said resin material; and mounting said stacked unit, in which said resin material has been filled in the space between the plurality of said semiconductor chips, on a wiring substrate.

14. The method of manufacturing a semiconductor device according to claim 13, wherein said semiconductor chips have a bump electrode on a surface of said semiconductor chips, and wherein in said stacking process, said semiconductor chips vertically arranged and adjacent to each other are interconnected to each other through said bump electrode.

15. The method of manufacturing a semiconductor device according to claim 13, wherein said masking material is made of a material having a heat resistant property.

16. The method of manufacturing a semiconductor device according to claim 13, further comprising;

covering an outer side of said stacked unit mounted on said wiring substrate with a resin molding material, after said mounting.

17. The method of manufacturing a semiconductor device according to claim 13, wherein in said filling process, a heating member is used to heat a plurality of said stacked units, wherein the heating member has a plurality of chip mounting areas and a heat-resistant material that fills the space between the plurality of said chip mounting areas, and the plurality of said stacked units are placed on the plurality of said chip mounting areas.

18. The method of manufacturing a semiconductor device according to claim 1, wherein said stacked unit is maintained at a temperature at which curing of said resin material occurs, during said supplying of said mixture.

19. The method of manufacturing a semiconductor device according to claim 2, wherein said stacked unit is maintained at a temperature at which curing of said resin material occurs, during said supplying of said mixture.

20. The method of manufacturing a semiconductor device according to claim 13, wherein said stacked unit is maintained at a temperature at which curing of said resin material occurs, during said supplying of said mixture.

* * * * *